US009590589B2

(12) United States Patent
Dadgar Javid et al.

(10) Patent No.: US 9,590,589 B2
(45) Date of Patent: Mar. 7, 2017

(54) ELECTROACOUSTIC TRANSDUCER HAVING A PIEZOELECTRIC SUBSTRATE WITH ELECTRODE FINGERS DIVIDED INTO FOUR GROUPS

(71) Applicant: EPCOS AG, Munich (DE)

(72) Inventors: Gholamreza Dadgar Javid, Munich (DE); Thomas Ebner, Munich (DE)

(73) Assignee: EPCOS AG, Munich (DE)

( * ) Notice: Subject to any disclaimer, the term of this patent is extended or adjusted under 35 U.S.C. 154(b) by 6 days.

(21) Appl. No.: 14/418,930

(22) PCT Filed: Jul. 11, 2013

(86) PCT No.: PCT/EP2013/064726
§ 371 (c)(1),
(2) Date: Jan. 30, 2015

(87) PCT Pub. No.: WO2014/019831
PCT Pub. Date: Feb. 6, 2014

(65) Prior Publication Data
US 2015/0214924 A1 Jul. 30, 2015

(30) Foreign Application Priority Data
Aug. 1, 2012 (DE) ........................ 10 2012 107 049

(51) Int. Cl.
*H03H 9/145* (2006.01)
*H03H 9/64* (2006.01)

(52) U.S. Cl.
CPC ...... *H03H 9/6406* (2013.01); *H03H 9/14505* (2013.01)

(58) Field of Classification Search
USPC .............................................. 310/313 B, 313
See application file for complete search history.

(56) References Cited

U.S. PATENT DOCUMENTS

| 5,331,247 A | 7/1994 | Ikeda et al. |
| 5,663,695 A * | 9/1997 | Tanaka ................. H03H 9/0042 310/313 B |

(Continued)

FOREIGN PATENT DOCUMENTS

| DE | 102005045638 A1 | 3/2007 |
| JP | S5419634 A | 2/1979 |

(Continued)

OTHER PUBLICATIONS

Bulst, W.-E. et al.: "Reproducible Fabrication of Surface Acoustic Wave Filters", Telecom-Report, No. 10, 1987, pp. 1-8.

(Continued)

*Primary Examiner* — J. San Martin
(74) *Attorney, Agent, or Firm* — McDermott Will & Emery LLP

(57) ABSTRACT

An electroacoustic transducer having an alternative finger structure is provided. The number of fingers of a cell of length A is divisible by four. The electrode fingers of the cell are divided into four groups. The distance ($\Delta_2$) between the second group and the third group is less than the distance ($\Delta_1$) between the first group and the second group and less than the distance ($\Delta_3$) between the third group and the fourth group.

10 Claims, 5 Drawing Sheets

(56) References Cited

U.S. PATENT DOCUMENTS

| | | | | |
|---|---|---|---|---|
| 5,815,055 | A * | 9/1998 | Eguchi | H03H 9/6406 310/313 B |
| 5,977,846 | A * | 11/1999 | Kajihara | H03H 9/14505 310/313 B |
| 6,075,426 | A * | 6/2000 | Tsutsumi | H03H 9/6426 310/313 B |
| 6,104,260 | A * | 8/2000 | Yamada | H03H 9/0042 333/193 |
| 6,211,600 | B1 * | 4/2001 | Martin | H03H 9/14505 310/313 B |
| 6,246,150 | B1 * | 6/2001 | Mitobe | H03H 9/6496 310/313 B |
| 6,297,713 | B1 * | 10/2001 | Kadota | H03H 9/0038 310/313 B |
| 6,343,049 | B1 * | 1/2002 | Toda | H04B 11/00 310/313 B |
| 6,710,683 | B2 * | 3/2004 | Nakamura | H03H 9/6426 310/313 B |
| 2001/0040421 | A1 | 11/2001 | Mitobe | |
| 2001/0040489 | A1 * | 11/2001 | Matsuda | H03H 9/02748 333/193 |
| 2002/0158715 | A1 | 10/2002 | Nakamura et al. | |
| 2003/0057805 | A1 | 3/2003 | Bergmann et al. | |
| 2003/0168931 | A1 * | 9/2003 | Nakamura | H03H 9/0042 310/313 B |
| 2008/0278031 | A1 | 11/2008 | Bergmann et al. | |

FOREIGN PATENT DOCUMENTS

| | | |
|---|---|---|
| JP | S616917 A | 1/1986 |
| JP | S61006917 | 1/1986 |
| JP | H0555862 A | 3/1993 |
| JP | H07231238 A | 8/1995 |
| JP | H11330895 A | 11/1999 |
| JP | 2001189637 A | 7/2001 |
| JP | 2003526240 A | 9/2003 |
| JP | 2009509430 A | 3/2009 |

OTHER PUBLICATIONS

Chang, R.E. et al.: "Experimental Study on the Performance of Dithered Single-Phase Unidirectional Transducers (DSPUDT) and Their Filter Applications on ST-Quartz and LITAO3 Substrate Materials", IEEE Ultrasonic Symposium, 1996, pp. 5-10.

Hanma, K. et al.: "A Triple Transit Suppression Technique", IEEE Vllrason. Sump. Proc., 1976, pp. 328-331.

Morgan, D.P.: "Surface-Wave Devices for Signal Processing", Studies in Electrical and Electronic Engineering 19, 1991, pp. 89-92.

Wright, P.V. et al.: "Single-Phase Unidierectional Transducers Employing Uniform-Width Dithered Electrodes", IEEE Ultrasonics Symposium, 1995, pp. 27-32.

* cited by examiner

ELECTROACOUSTIC TRANSDUCER HAVING A PIEZOELECTRIC SUBSTRATE WITH ELECTRODE FINGERS DIVIDED INTO FOUR GROUPS

The invention relates to electroacoustic transducers, which may for example be used in filters operating with acoustic waves.

Electroacoustic transducers convert radiofrequency electromagnetic signals into acoustic waves and vice versa. Such transducers are suitable, for example, for use in bandpass filters or bandstop filters for mobile communication devices.

US 2003/0057805 A1 discloses electroacoustic transducers in a split finger arrangement, which are optimized for particular requirements in terms of their parameters: reflectivity, insertion attenuation and directionality of their emission direction.

The application field for transducers operating with acoustic waves is large. Correspondingly, there are applications with different requirements, which need alternative optimization of the parameters mentioned above, or other parameters.

It is therefore an object of the present invention to provide an alternative transducer structure.

This object is achieved by the electroacoustic transducer according to independent claim 1. Dependent claims specify advantageous configurations of the invention.

An electroacoustic transducer comprises a piezoelectric substrate having electrode fingers, which are arranged over the piezoelectric substrate. The transducer comprises, in particular, a cell of length $\lambda$, which has N electrode fingers. $\lambda$ is the wavelength of the acoustic wave at the working frequency of the transducer. The N electrode fingers of the cell are divided into four groups arranged along the propagation direction of the acoustic wave. The first group comprises n1 fingers. The finger spacing within the first group is D1. The distance between the first group and the second group, that is to say between the fingers of the first group and between the fingers of the second group, is $\Delta 1$. The second group comprises n2 fingers. The finger spacing within the second group is D2. The distance between the second and third groups is $\Delta 2$. The third group comprises n3 fingers. The finger spacing within the third group is D3. The distance between the third and fourth groups is $\Delta 3$. The fourth group comprises n4 fingers. The finger spacing within the fourth group is D4. Furthermore: n1+n2+n3+n4=N. In addition: $\Delta 2$ is not equal to $\Delta 1$ or $\Delta 2$ is not equal to $\Delta 3$. N is four times an integer k≥1.

In one embodiment: $\Delta 2$ is less than $\Delta 1$ and $\Delta 2$ is less than $\Delta 3$.

The smallest number of fingers per cell is N=4 for k=1. The minimum number of fingers per group is 1. For k=1 and N=4, each group thus consists of one finger. Since each group comprises only one finger, there is consequently no finger spacing within a group. The finger spacing between the fingers of a group is therefore only defined for k≥2. The fact that no finger spacing within a group is defined for k=1 does not, however, represent a problem for the rest of the consideration. In particular, the quantities $\Delta 1$, $\Delta 2$ and $\Delta 3$ are well defined for all k, n1, n2, n3, n4 and N≥4.

The group to which an electrode finger is assigned determines the busbar to which the finger is electrically conductively connected. There are neighboring electrode fingers which are connected to busbars of opposite polarity. Between such electrode fingers, there is an excitation center for acoustic waves. In contrast thereto, the space between two electrode fingers connected to the same busbar is essentially field-free, for which reason essentially no excitation of acoustic waves takes place between such fingers.

As a result of the fact that the spacings $\Delta 1$, $\Delta 2$ and $\Delta 3$ between the individual groups are now set as indicated above, this cell of the transducer has a finite reflectivity for acoustic waves. It therefore differs, for example, from the cell of FIG. 3 of US 2003/0057805 A1, which describes a conventional split finger arrangement substantially without reflectivity. If such cells with finite, and in particular adjustable, reflectivity are arranged suitably in an acoustic track, versatile optimization possibilities are made available.

Furthermore, the distance between electrode fingers which are connected to different busbars, and between which there is therefore an excitation center for acoustic waves, is modified. Correspondingly, the electrical capacitance of the cell also changes, without it being necessary to increase the total length of the cell per se or vary the aperture or the finger number.

The provision of different distances between the finger groups also provides further degrees of freedom in the development of electroacoustic transducers, in order to fulfill special requirements of the transducer.

It is possible for the transducer to have a multiplicity of corresponding cells. These cells may then be arranged successively in a periodic structure or in a structure which is periodic in sections.

In one embodiment, a preceding finger is arranged before the cell. The distance between the preceding finger of the first group is less than $\Delta 1$. The distance between the first group and the finger preceding the first group is thus less than the distance between the first group and the second group. If there is an excitation center between the preceding finger and the first group, the electrical capacitance at this position is locally increased.

The overall transducer may comprise precisely one, several or a multiplicity of the cells mentioned above. Correspondingly, it is possible to adjust the local electrical capacitance along the propagation direction of the acoustic waves.

In one embodiment, a subsequent finger is arranged after the cell and the distance between the fourth group and the subsequent finger is less than $\Delta 3$.

If there is a periodic arrangement of cells in succession, then a finger preceding a cell corresponds to the last finger of the preceding cell, and correspondingly to the last finger of the present cell. Similar considerations apply for subsequent fingers. Cells may be arranged periodically in succession, although they do not have to be. The periodicity is also interrupted at the start and at the end of a periodic arrangement.

In one embodiment, an excitation center is then furthermore arranged between the fourth group and the subsequent finger.

In one embodiment, an excitation center is arranged between the second group and the third group. It is thus possible for the fingers of the second group to be connected to one of the two busbars, while the fingers of the third group are connected to the other busbar.

In one embodiment, the number of fingers in all the groups is the same. Thus, n1=n2=n3=n4.

In one embodiment, the spacing of the fingers within the various groups, so long as a group has more than one finger, is the same. Thus: D1=D2=D3=D4.

In one embodiment, the distance between the first group and the second group is equal to the distance between the third group and the fourth group: $\Delta 1=\Delta 3$. This distance may be greater than the distance $\Delta 2$ between the second group and the third group: $\Delta 1 = \Delta 3 > \Delta 2$. In other words, it is possible that, for each excitation center:

The electrode fingers of different polarity defining the excitation center are to be shifted relative to one another compared with conventional split finger transducers without reflection. The corresponding other fingers of the respective finger groups are correspondingly moved up, so that the spacing within the finger group remains the same. If, for example, the first finger of a group is shifted by a distance d toward the excitation center, than the other fingers of the corresponding group are shifted correspondingly further toward the excitation center when their number within the group is greater.

The value may in this case be positive and negative. Positive values mean that the fingers are shifted toward the excitation center. Negative numbers mean that the fingers are shifted away from the excitation center.

The counting of the groups, or of the fingers within a group, is in this case carried out "from left to right". In particular when the cell has point symmetry with respect to its midpoint, the side from which the transducer is considered is unimportant. The corresponding numberings of groups and fingers are well defined.

In one embodiment, k is 1, 2, 3 or 4, or an even larger natural number.

Furthermore, it is possible for the finger spacings within a group D1, D2, D3 and D4 to be equal to the distance $\Delta 2$ between the second and third groups. This distance may also be equal to the distance between the first group and the preceding finger of the cell, as well as the spacing of the fourth group and the subsequent finger of the cell.

In one embodiment, the electroacoustic transducer operates with surface acoustic waves (SAW) or guided bulk acoustic waves (GBAW).

The electroacoustic transducer will be explained in more detail below with the aid of schematic examples and figures. Various figures show various aspects of the invention, although these are not mutually exclusive but may be combined.

Figure 3:
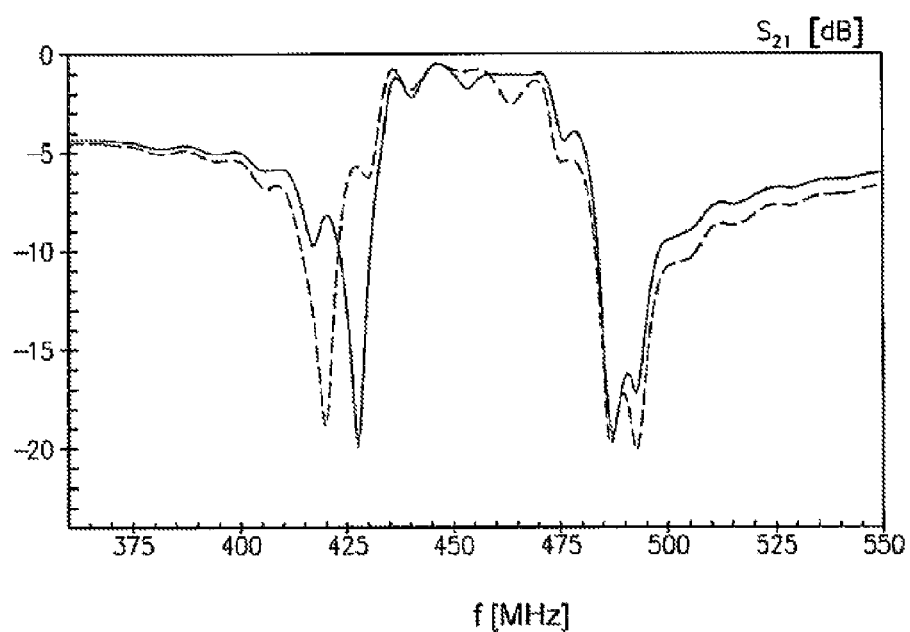
Figure 4:
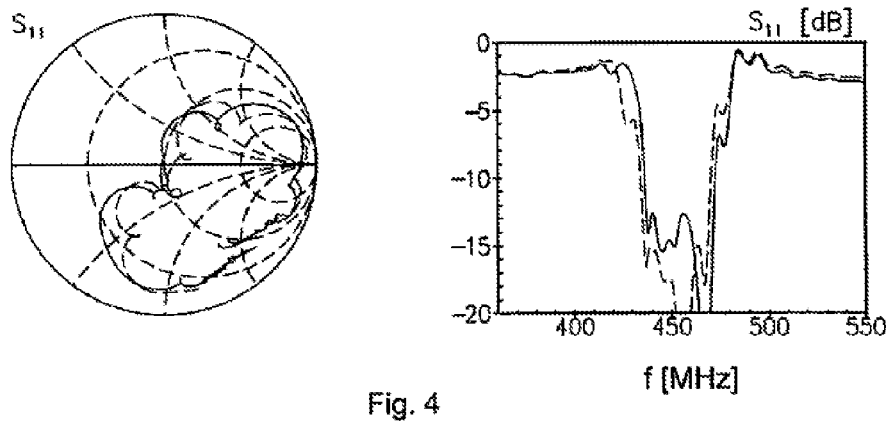
Figure 5:
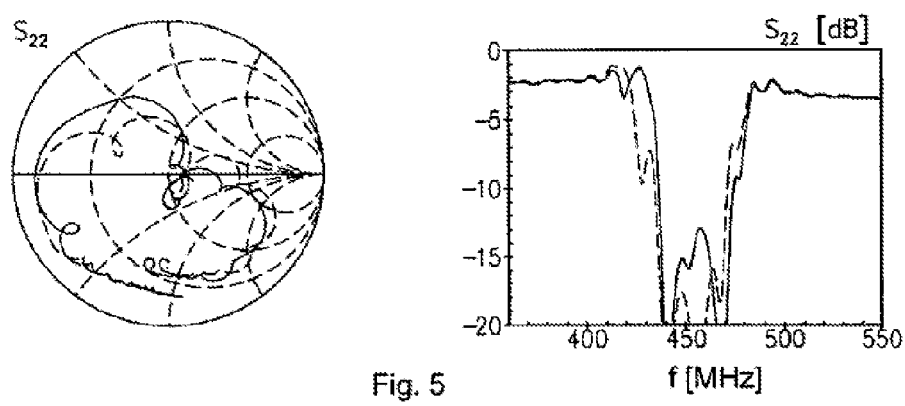
Figure 6:
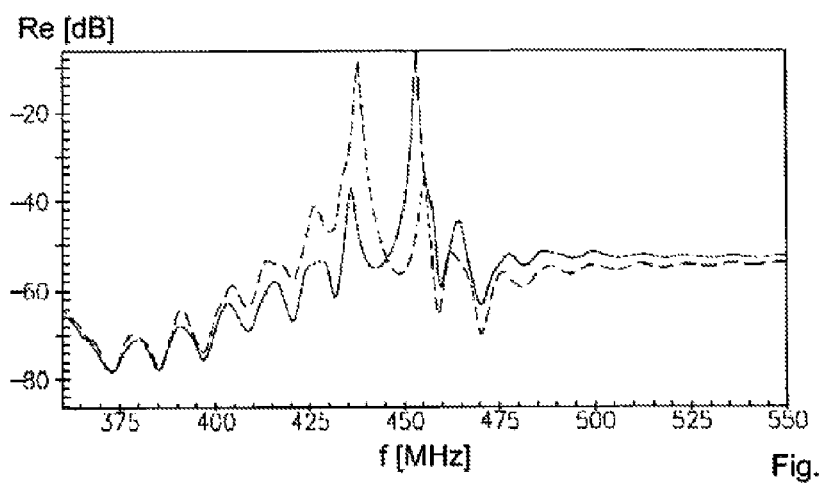
Figure 7:
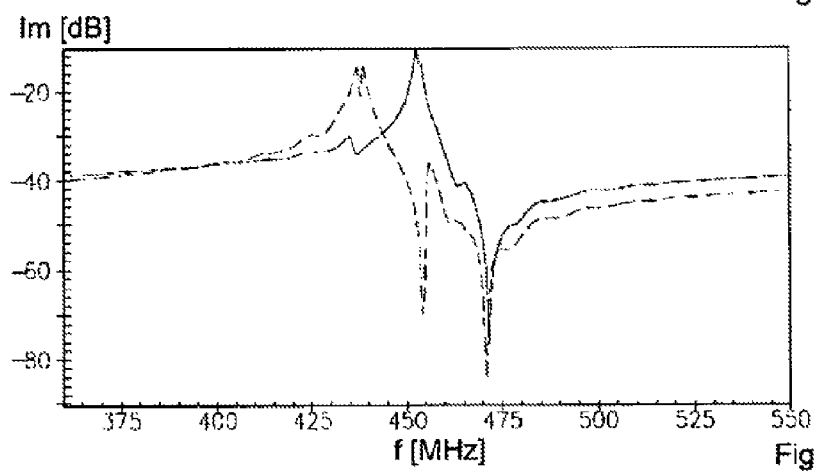
Figure 8:
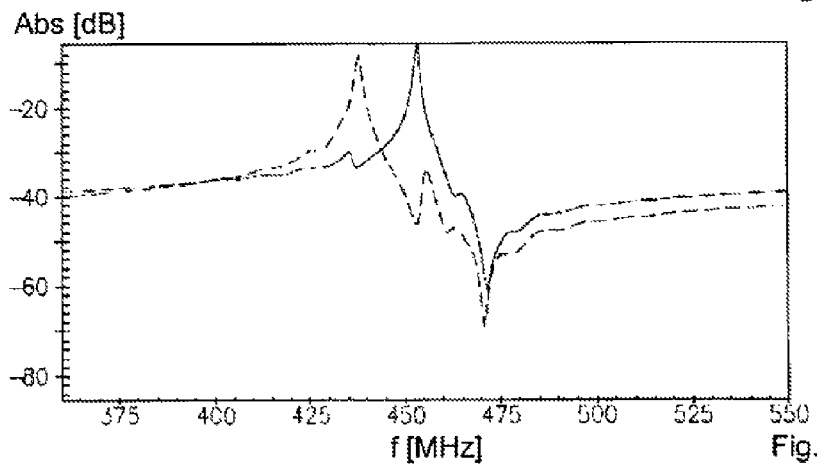

FIG. 3 shows a calculated transfer function $S_{21}$ for reduced distances (solid curve) between two electrode fingers of an excitation center, and for increased distances (dashed curve) between the fingers of an excitation center, FIG. 4 shows calculated curves of the reflectivity $S_{11}$ at the input port of a transducer for reduced distances (solid curve) and increased distances (dashed curve), FIG. 5 shows the reflection $S_{22}$ at the output port for reduced distances (solid curve) and increased distances (dashed curve), FIG. 6 shows the real part of the admittance of a transducer for reduced distances (solid curve) and increased distances (dashed curve), FIG. 7 shows the imaginary part of the admittance of a transducer for reduced distances (solid curve) and increased distances (dashed curve), FIG. 8 shows the magnitude of the admittance of a transducer for reduced distances (solid curve) and increased distances (dashed curve).

Figure 1:
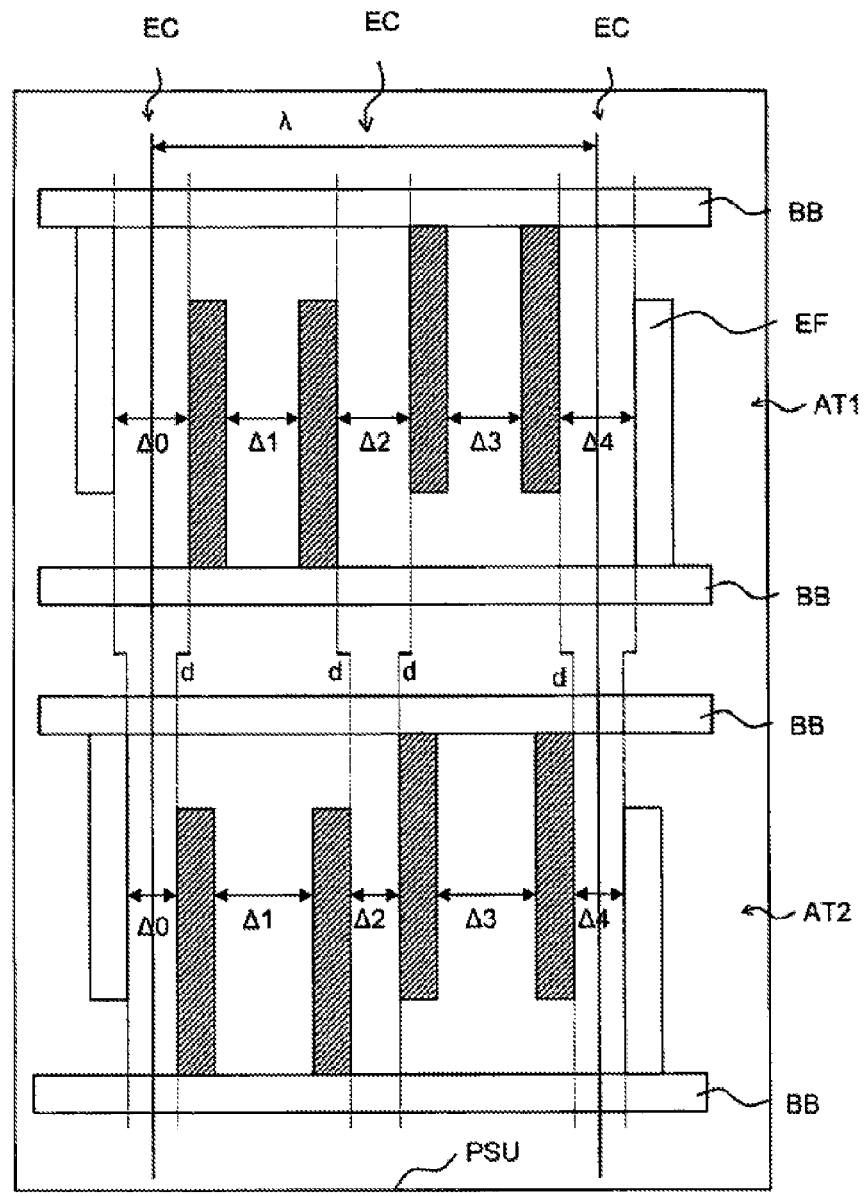
FIG. 1 shows an embodiment with four fingers per wavelength $\lambda$.

FIG. 1 shows a conventional (split finger) cell of an electroacoustic transducer of length $\lambda$ in a first acoustic track AT1 and, for comparison, an optimized cell of length $\lambda$ of a second transducer in an acoustic track AT2. The transducer cell of the track AT1 is essentially a conventional split finger transducer cell, as known for example from US 2003/0057805 A1. $\Delta 1$ denotes the distance between the first group, which comprises only one electrode finger, and the second group, which likewise comprises one electrode finger. $\Delta 2$ describes the distance between the finger of the second group and the single finger of the third group. $\Delta 3$ describes the distance between the single finger of the third group and the single finger of the fourth group.

In contrast thereto, the transducer structure of the acoustic track AT2 represents an optimized finger arrangement, the fingers of the first group being shifted to the left toward the excitation center EC by the amount d. The finger of the second group is shifted to the right toward the excitation center EC by the amount d. The finger of the third group is shifted to the left toward the excitation center between the second finger and the third finger by the amount d. The fourth finger is shifted to the right toward the excitation center between the fourth finger and the subsequent finger by the amount d. Overall, all the fingers of the corresponding group are thus shifted toward the closest excitation center. The distance $\Delta 2$ between the second group and the third group is less than the distance $\Delta 1$ between the first group and the second group, and less than the distance $\Delta 3$ between the third group and the fourth group.

Independently of the number of cells and the number of fingers per cell, it is possible that: $\Delta 1 = \Delta 3$ and $\Delta 2 = \Delta 4$.

Since each of the four finger groups comprises only a single finger, there are no spacings of the fingers within a group.

Figure 2:
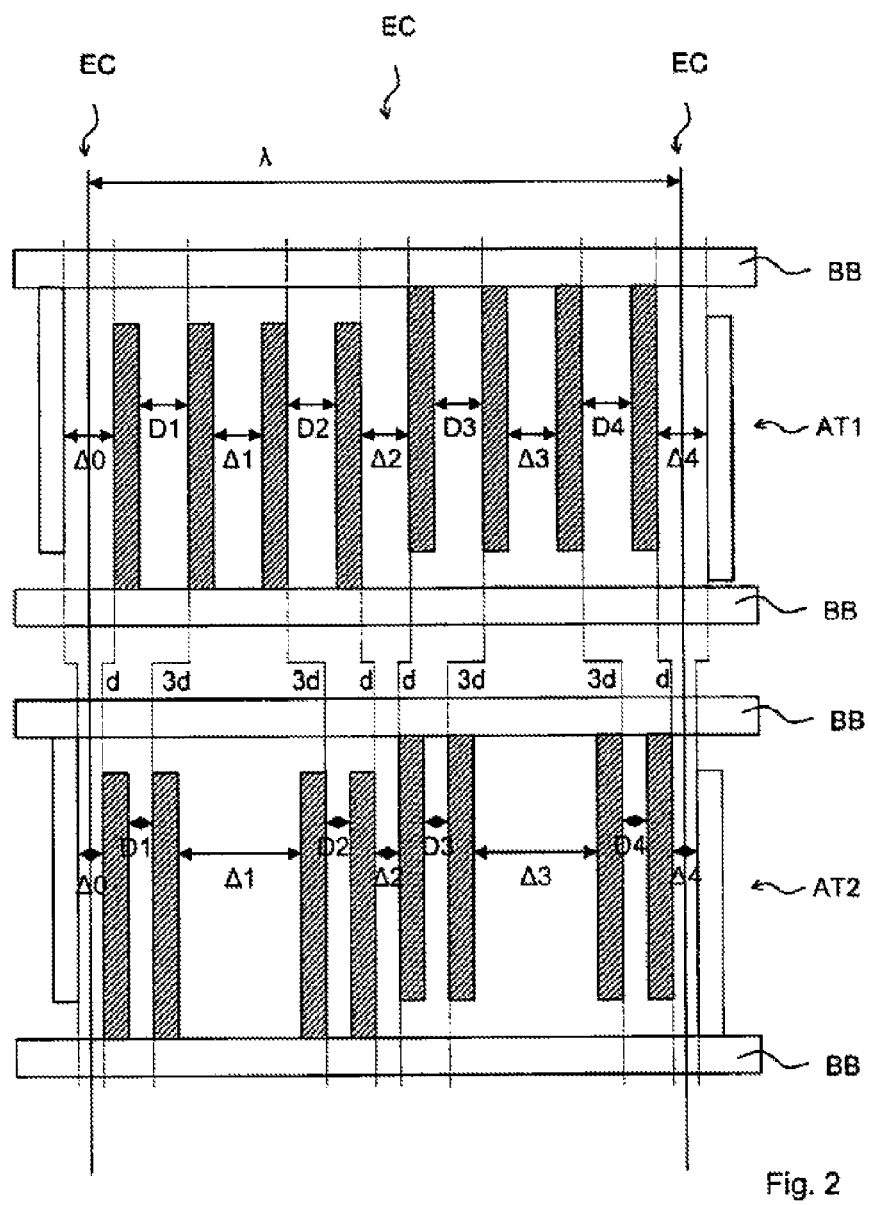
FIG. 2 shows an embodiment with eight fingers per $\lambda$.

In contrast to FIG. 1, FIG. 2 shows two cells, in which each of the four groups comprises precisely two electrode fingers. In each group, there is therefore precisely one spacing between the first finger and the second finger. The spacings within the group are correspondingly denoted by D1, D2, D3 and D4. The quantities $\Delta 1$, $\Delta 2$ and $\Delta 3$ denote, as before, the distances between the corresponding groups. The finger arrangement of the acoustic track AT1 shows a cell of length $\lambda$ of a transducer, in which the spacings of the groups are equal. In contrast thereto, the acoustic track AT2 comprises a finger arrangement in which the finger next to an excitation center EC are shifted toward the excitation center by an amount d. The other respective finger of a group is likewise shifted in the direction of the excitation center, but by the amount 3d.

In configurations of cells with more than two fingers per group, the finger next to an excitation center would be shifted by an amount d. The subsequent finger of the same group would be shifted by the amount 3d. The third finger of a group would be shifted by the amount 5d. In general, the $i^{th}$ finger of a group is shifted in the direction of the excitation center lying closest to the group by the amount $(2i-1)d$. This applies for the situation when the finger spacings in all groups are equally large and the distance $\Delta 2$ between the second group and the third group is equal to the correspondingly set finger spacing D1=D2=D3=D4. Precisely one further parameter, namely d, is thus obtained, from which the offset of each individual electrode finger $(2n-1)d$ is derived. The arrangement of all the electrode fingers of a cell of length $\lambda$ is therefore well defined by a single parameter. Overall, a transducer which is optimized in relation to the reflectivity and the electrical capacitance is obtained. A corresponding cell may thus be adjusted by variation of a single parameter in a method for the optimization of a transducer. Furthermore: With a given minimum spacing d between the fingers, the cell with equal distances between the fingers D1=D2= . . . has the maximum static capacitance and the maximum reflection.

The offset d is in this case positive when a finger next to an excitation center is shifted in the direction of the excitation center. If they are shifted in the opposite direction, i.e. away from the excitation center, the offset d is negative.

FIG. 3 shows the transfer function $S_{21}$ for positive d (solid curve) and for negative d (dashed curve). Although the absolute length of the cell, which corresponds to the wavelength λ, is maintained, the characteristic frequencies of the low-frequency edge of the transmission range are shifted. Thus, for positive d, the low-frequency edge has a smaller transition width. Furthermore, the waviness in the passband can be reduced.

FIG. 4 shows the reflectivity $S_{11}$ of a correspondingly configured transducer, with positive d (solid curve) and negative d (dashed curve). The frequency-dependent impedance is shown in the Smith chart on the left in FIG. 4. The right-hand part of FIG. 4 shows that the transducer is essentially transmissive for frequencies in the range of the passband. The curves furthermore differ depending on the direction in which the electrode fingers are shifted.

FIG. 5 shows the reflectivity $S_{22}$ at the output port in a similar way to FIG. 4.

FIGS. 3, 4 and 5 relate to a ladder-type filter having a metallization height of 200 nm, an average finger period (pitch) of 5 μm and a metallization ratio eta of 0.5.

FIG. 6 shows the real part of the admittance of a corresponding transducer with positive d (solid curve) and negative d (dashed curve).

FIG. 7, in contrast to FIG. 6, shows the imaginary part of the admittance.

FIG. 8 shows the magnitudes of the admittance, on the one hand for positive d (solid curve) and for negative d (dashed curve).

FIGS. 6, 7 and 8 relate to a resonator with a metallization height of 400 nm, a pitch of 5.0 μm and a metallization ratio eta of 0.5.

All of FIGS. 3 to 8 relate to transducers having cells with four fingers per λ, i.e. a cell structure as shown in FIG. 1 in the acoustic track AT2.

An electroacoustic transducer according to the invention is not restricted to one of the exemplary embodiments described. Transducers having additional cells and additional metallization structures or layer systems on a piezoelectric substrate, or on the electrode fingers, or between the electrode fingers and the piezoelectric substrate, which contribute to guiding acoustic waves in the acoustic track, likewise represent exemplary embodiments according to the invention.

LIST OF REFERENCES

AT1, AT2: acoustic track
BB: busbar
d: offset of an electrode finger next to an excitation center
D1, D2, D3, D4: finger spacings within the first, second, third and fourth groups
EC: excitation center
EF: electrode finger
F: frequency
PSU: piezoelectric substrate
$S_{11}$: reflectivity at the input port
$S_{21}$: transfer function
$S_{22}$: reflectivity at the output port
Δ1, Δ2, Δ3: distances between the first, second, third and fourth finger groups
λ: wavelength of the acoustic wave

The invention claimed is:

1. An electroacoustic transducer, comprising:
   a piezoelectric substrate (PSU) having electrode fingers (EF) arranged over the piezoelectric substrate (PSU); and
   a cell of length λ having N electrode fingers (EF),
   wherein
   λ is the acoustic wavelength,
   the N electrode fingers (EF) of the cell are divided into four groups arranged along the propagation direction of the acoustic wave,
   the first group comprises n1 fingers (EF), the finger spacing within the first group is D1, and the distance between the first and second groups is Δ1,
   the second group comprises n2 fingers (EF), the finger spacing within the second group is D2, and the distance between the second and third groups is Δ2,
   the third group comprises n3 fingers (EF), the finger spacing within the third group is D3, and the distance between the third and fourth groups is Δ3,
   the fourth group comprises n4 fingers (EF), the finger spacing within the fourth group is D4,
   n1+n2+n3+n4=N,
   Δ2 is not equal to Δ1 or Δ2 is not equal to Δ3,
   D1=D2=D3=D4=Δ2, and
   N is four times an integer k>=2.

2. The electroacoustic transducer according to claim 1, wherein Δ2<Δ1 and Δ2<Δ3.

3. The electroacoustic transducer according to claim 1, wherein a preceding finger (EF) is arranged before the cell and the distance between the preceding finger (EF) and the first group is less than Δ1.

4. The electroacoustic transducer according to claim 1, wherein a preceding finger (EF) is arranged before the cell, and an excitation center (EC) is arranged between the preceding finger (EF) and the first group.

5. The electroacoustic transducer according to claim 1, wherein a subsequent finger (EF) is arranged after the cell, and the distance between the fourth group and the subsequent finger (EF) is less than Δ3.

6. The electroacoustic transducer according to claim 1, wherein a subsequent finger (EF) is arranged after the cell, and an excitation center (EC) is arranged between the fourth group and the subsequent finger (EF).

7. The electroacoustic transducer according to claim 1, wherein an excitation center (EC) is arranged between the second group and the third group.

8. The electroacoustic transducer according to claim 1, wherein n1=n2=n3=n4.

9. The electroacoustic transducer according to claim 1, wherein Δ1=Δ3.

10. The electroacoustic transducer according to claim 1, wherein k is either 2, 3 or 4.

* * * * *